United States Patent [19]

Schabaner

[11] Patent Number: 4,777,430
[45] Date of Patent: Oct. 11, 1988

[54] CIRCUIT FOR DETERMINING THE EFFECTIVE SERIES RESISTANCE AND Q-FACTOR OF CAPACITORS

[75] Inventor: Fritz M. Schabaner, Bay Shore, N.Y.

[73] Assignee: American Technical Ceramics Corp., Huntington Station, N.Y.

[21] Appl. No.: 26,264

[22] Filed: Mar. 16, 1987

[51] Int. Cl.[4] .................... G01R 27/02; G01R 27/26
[52] U.S. Cl. .............................. 324/60 R; 324/57 Q; 330/79
[58] Field of Search .............. 324/57 R, 57 Q, 59, 324/58.5 C, 60 R, 61 QL, 61 QS, 81; 330/79, 80, 85

[56] References Cited

U.S. PATENT DOCUMENTS

| | | | |
|---|---|---|---|
| 3,034,044 | 5/1962 | Konigsberg | 324/60 R |
| 3,626,285 | 12/1971 | Hartke | 324/60 R |
| 3,631,336 | 12/1971 | Marvin | 324/57 Q |
| 3,840,805 | 10/1974 | Martyashin et al. | 324/57 Q |
| 3,970,925 | 7/1976 | Procter et al. | 324/57 Q |
| 4,283,675 | 8/1981 | Sparber | 324/57 Q X |
| 4,419,623 | 12/1983 | Ketchledge | 324/61 QS X |

Primary Examiner—Reinhard J. Eisenzopf
Assistant Examiner—Jack B. Harvey
Attorney, Agent, or Firm—Edward H. Loveman

[57] ABSTRACT

A meter circuit for measuring the effective series resistance (ESR) and Q-Factor of a capacitive device has an operational amplifier with an input to which a source of AC input voltage is applied. A feedback circuit is connected between output and input of the amplifier. A series network is connected between the feedback circuit and ground. This network has an inductor of known Q-Factor in series with a capacitive device whose Q-factor is to be determined. Voltmeters measure the applied input voltage and output voltage of the amplifier. Where the series resistances of the inductor and capacitive device at resonance frequency have a low total magnitude, the meter circuit can be modified by inserting a wideband transformer, having very low output impedance, in the feedback circuit in series with an adjustable gain operational amplifier.

9 Claims, 2 Drawing Sheets

CIRCUIT FOR DETERMINING THE EFFECTIVE SERIES RESISTANCE AND Q-FACTOR OF CAPACITORS

FIELD OF THE INVENTION

This invention relates to the art of electrical measuring instruments, and more particularly concerns Q-meter circuits or meters for measuring Q-factors of circuits or circuit components such as capacitors operating at a range of frequencies.

BACKGROUND OF THE INVENTION

The Q-factor or Q of a circuit component such as capacitor, or inductor of an electric circuit, is a figure of merit or quality. The Q(quality)-factor is the ratio of the reactance to the resistance of the electric component or circuit at any particular frequency of operation. Measurement of the Q-factors of capacitors or inductors with Q-meters are conventionally made by injecting a known voltage at a particular frequency in series with an inductance-capacitance network. The Q-factor may then be stated as:

$$Q = \frac{V_2}{V_1}$$

where Q is the Q-factor, $V_2$ is the output voltage measured across the capacitor at the series resonant frequency of the network, and $V_1$ is the injection voltage or voltage applied to the network.

DESCRIPTION OF THE PRIOR ART

FIG. 1 shows a Q-factor test circuit used in the prior art to measure the quality factor of a capacitor, $C_x$, under test in the shunt or parallel mode. The applied alternating voltage E is measured by a voltmeter $V_I$. The injection resistance $R_i$ has a very low resistance value. The inductor L has an inductance of known value and is connected in series with the injection voltage E. A low loss variable capacitor $C_v$ is connected in series with the inductance L. The Capacitor $C_x$ is connected in series with a switch S, and both the capacitor $C_x$ and the switch S are connected in parallel or shunt with the capacitor $C_v$.

The unknown Q-factor $C_x$ of the capacitor $C_x$ may be expressed as follows:

$$Q_x = \frac{Q_1 Q_2 (C_2 - C_1)}{(Q_1 - Q_2) C_1},$$

where $Q_x$ is the Q-factor of capacitor $C_x$; $C_1$ is the capacitance of capacitor $C_v$, and $Q_1$ is the Q-factor with the switch S open; $C_2$ is the capacitance of capacitor $C_v$ and $Q_2$ is the Q-factor with the switch S closed.

The parallel resistance $R_p$ of the capacitor $C_x$ may be stated:

$$R_p = \frac{Q_1 Q_2}{w C_1 (Q_1 - Q_2)},$$

where $w$ (omega)$=2\pi f$, and f is the frequency.

The effective series resistance ESR of the capacitor $C_x$ at the resonant frequency of the inductance-capacitance network is:

$$ESR = \frac{R_p}{1 + Q_x^2},$$

or stated more simply:

$$ESR = \frac{X_{cx}}{Q_x}$$

where $X_{cx}$ is the reactance of the capacitance at resonance; and $$Q_x = \frac{X_{cx}}{ESR}.$$

It will be noted that to measure the Q-factor of the parallel circuit it is necessary to determine ESSR, $Q_1$ and $Q_2$ as defined above. The above outlined measurements are acceptable for Q-factors of less than 1000. With increasing Q-factors, increasing frequency, and increasing capacitance, large errors in Q-factor measurement errors occur due to a combination of conductance of the Q-voltmeter $V_2$, injection resistance, energy losses in the tuning Q-capacitor $C_v$, and the difficulty of resolving the difference between $Q_1$ and $Q_2$ for high Q-factor components.

For very high-Q capacitors having Q-factors greater than 1000 and up to 10,000 and more, the Q-difference, i.e. $\Delta Q$ between $Q_1$ and $Q_2$ approaches zero. That small Q-difference or $\Delta Q$ cannot be resolved by the instrument or operator, and as a result such high-Q measurements made by Q-meter circuits heretofore known, become questionable or meaningless.

SUMMARY OF THE INVENTION

It is therefore a principal object of the present invention to overcome the objections to and difficulties and disadvantages of prior Q-factor measuring circuits by providing a circuit capable of accurately measuring Q-factors having greater numerical magnitudes than is possible with known types of Q-meters.

According to the invention the Q-measuring circuit has an operational amplifier at whose input is applied a variable AC voltage. The amplifier is provided with a feedback circuit between its output and input. The feedback circuit contains a resistor of known resistance value and a series circuit including an inductor of known Q-factor and a capacitor or capacitive device whose ESR and Q-factor is to be determined by the measuring circuit. Voltmeters at input voltage source and output of the amplifier provide voltage gain measurements thereat. From the readings obtained by these voltmeters and from the known circuit parameters it is possible to determine accurately the ESR and/or Q-factor of the capacitor device under test. In instances where the series resistance of the inductor and the effective series resistance of the capacitor, at resonance of the series circuit are low, it is still possible to obtain accurate ESR measurements by a modification of the invention. That is, a wideband voltage stepdown transformer having a very low output impedance is connected in the amplifier's feedback circuit along with a second operational amplifier to compensate for the voltage step-down of the transformer. The second amplifier has an output-to-input feedback network with an adjustable resistor for calibration purposes. A third operational amplifier having output-to-input feedback may be inserted in the feedback circuit of the first named amplifier between the transformer and first amplifier to serve as a buffer.

These and other objects and many of the attendant advantages of this invention will be readily appreciated as the same becomes better understood by reference to the following detailed description when considered in connection with the accompanying drawing in which:

DESCRIPTION OF THE PREFERRED EMBODIMENTS

Figure 2:
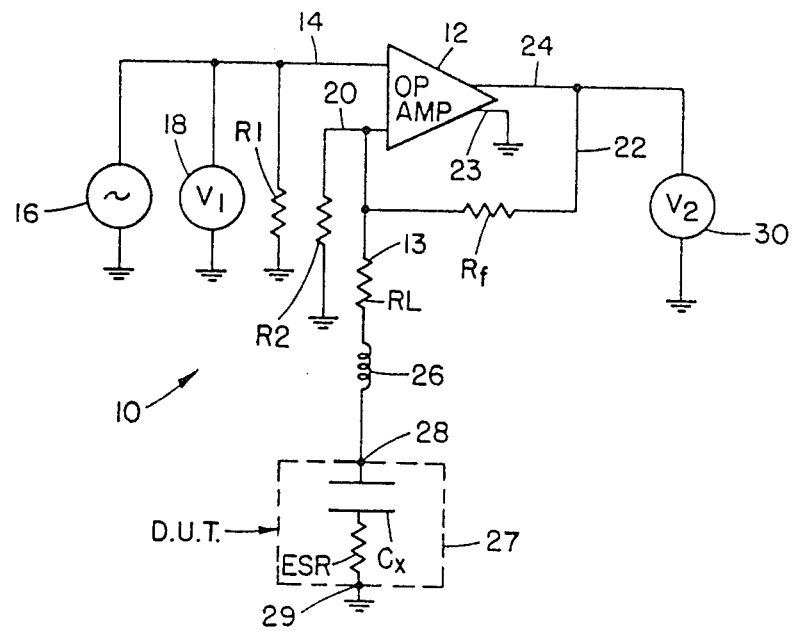
FIG. 2 is a diagram of a first ESR and Q-measuring circuit embodying the invention, shown with a capacitive device under test whose Q-factor is to be determined.

Referring now to the drawings wherein like reference characters designate like or corresponding parts throughout, there is illustrated in FIG. 2, an ESR and Q-factor measuring circuit generally designated as reference numeral 10 embodying the invention. The circuit 10 has an operational amplifier 12 connected between input 14 of the amplifier 12 and a generator of a variable frequency voltage source 16. The input voltage V is measured by a voltmeter 18 connected across the voltage source 16. A resistor R1 is also connected between the input 14 and the ground. Another resistor R2 is connected between an input terminal 20 and the ground. A resistor $R_f$ is connected in a feedback circuit 22 between an output terminal 24 and the input terminal 20. An output terminal 23 is grounded. An inductor 26 having a known inductance value and series resistance $R_L$, 13 is connected to the feedback circuit 22 between a circuit test point 28 and the input terminal 20. In series with the inductor 26 is inserted a device under test (DUT) 27, whose ESR and Q-factor is to be determined. The device 27 may be a capacitor $C_x$ connected between a test point 28 and a grounded test point 29. A voltmeter 30 is connected between the output terminal 24 and the output terminal 23 at ground, to measure an output voltage $V_2$ of the amplifier 12.

Figure 3:
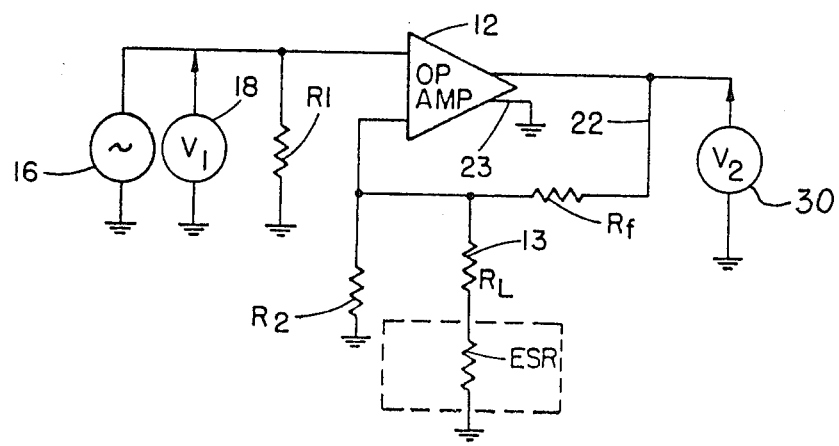
FIG. 3 is a diagram of the equivalent circuit of FIG. 2, shown under resonance conditions for the capacitive device under test and whose Q-factor is to be determined.

The manner in which the circuit 10 is used to determine the Q-factor of the device 27 will now be explained with particular reference to FIG. 3 which depicts the circuit 10 at resonance conditions. The series resonant inductor-capacitor components 26, 27 may be represented by a resistance $R_L$ in series with a resistance ESR, where $R_L$ is the series resistance of the inductor 26 at resonance of the components 26, 27, and ESR is the series resistance of the capacitor $C_x$ at resonance of the components 26, 27. The resistance ESR is the effective series resistance to be determined for calculating the Q-factor of the capacitive device 27. The resistance of resistor $R_2$ is very much greater than $R_L+ESR$.

For a noninverting circuit the gain at resonance is:

$$A = 1 + \frac{R_f}{(R_L + ESR)} \quad (1)$$

$$ESR = \frac{R_f}{(A-1)} - R_L \quad (2)$$

The capacitive reactance $X_c$ of the capacitor $C_x$ under test is:

$$X_c = \frac{1}{2\pi f C_x}, \quad (3)$$

where f is the resonance frequency and $C_x$ is the capacitance of the capacitor $C'_x$ or the device 27. The Q-factor $Q_x$ of the capacitor $C_x$ is:

$$Q_x = \frac{X_{cx}}{ESR} \quad (4)$$

Figure 1:
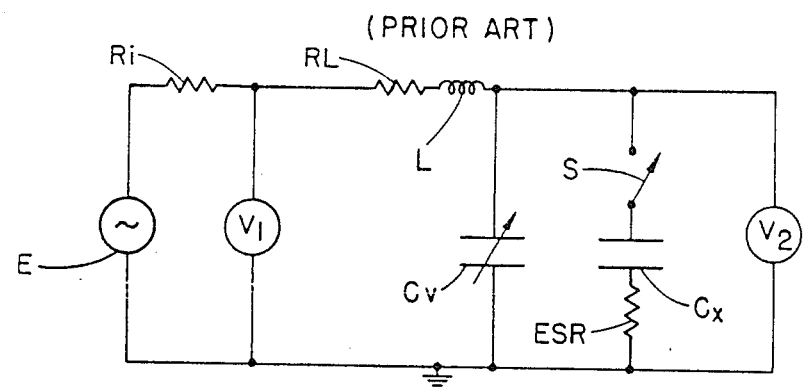
FIG. 1 is a diagram of an ESR and Q-measuring circuit used in explaining the prior art.

The effective series resistance ESR is readily determined from equations (1)–(3), since the resistances $R_f$ and $R_L$ are known and gain A is determined by the voltmeters 18 and 30. The reactance $X_c$ of the capacitor $C_x$ is determined from equation (3) where resonance frequency f and capacitance C are known. Thus the Q-factor of the capacitive device 27 as defined by equation (4) is readily determined. The test circuit 10 shown in FIG. 2 provides a determination of Q-factor which is more accurate and reliable then which may be obtained with the prior art circuit shown in FIG. 1.

Figure 4:
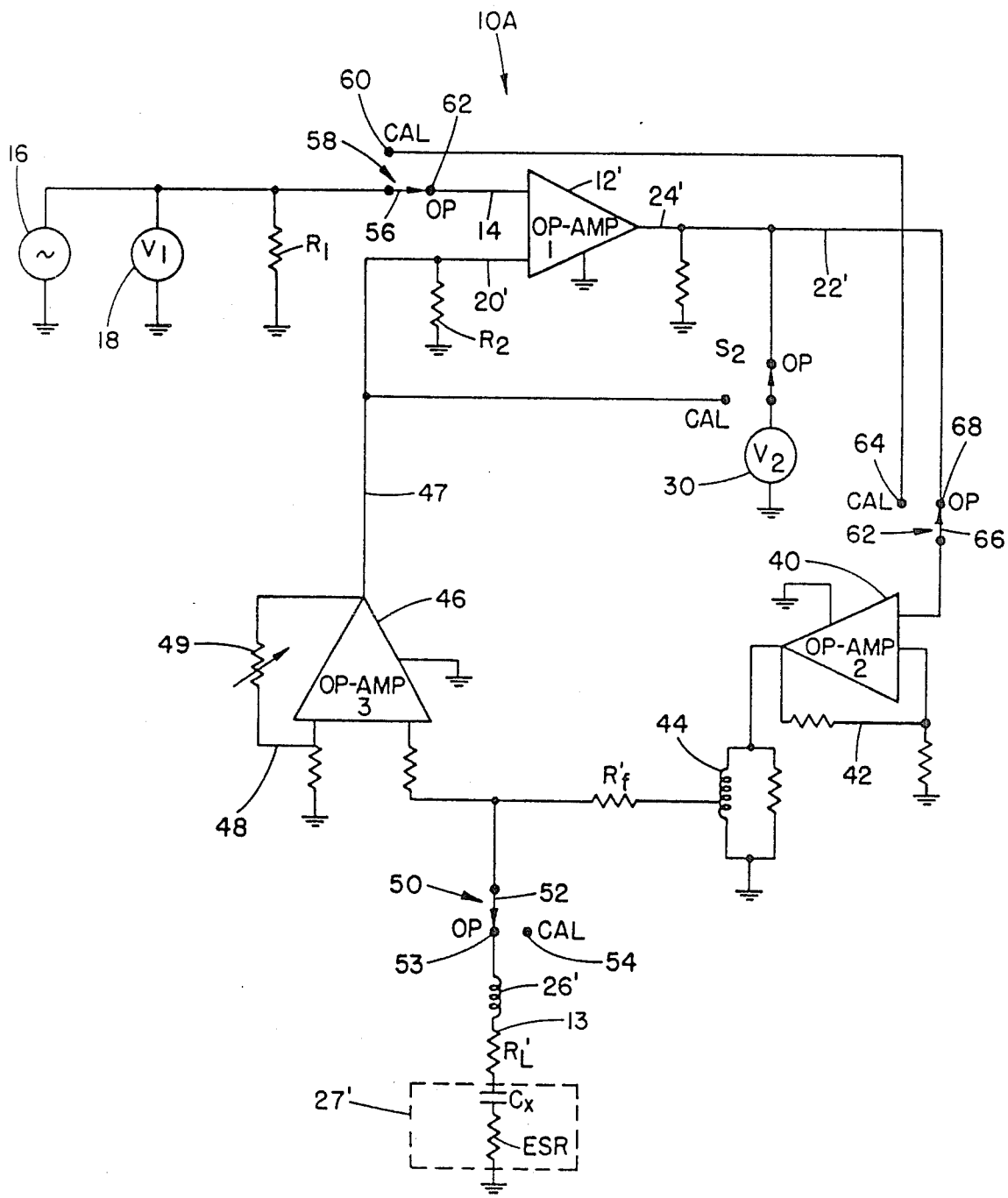
FIG. 4 is a diagram of another Q-measuring circuit similar to that of FIG. 2, but embodying a modification of the invention.

Normally the total series resonance resistance $R_L+ESR$ at resonance is the low magnitude, on the other hand, the feedback resistance used with typical operational amplifiers is fairly high which would result in impractical high gains per equation (1) above. A practical approach for this problem is the use of an impedance step-down device such as a transformer having a very low output impedance, as illustrated in the circuit 10A of FIG. 4. Parts of circuit 10A corresponding to those of circuit 10 in FIG. 2 are correspondingly numbered in FIG. 4.

In the circuit 10A, a feedback circuit 22' is connected to an output 24' of an operational amplifier 12'. In the feedback circuit 22' is an operational amplifier 40 which has a feedback line 42 connected between the input and output. The amplifier 40 primarily serves as a buffer. In series with the amplifier 40 in the feedback network 22' is a voltage stepdown transformer 44. This is a wideband transformer having a very low output impedance. A resistance $R_f$ corresponds to the resistor $R_f$ in the feedback circuit 22 of the circuit 10. Another operational amplifier 46 is connected in the feedback circuit 22' which has a feedback circuit 48 in which is a variable resistor 49 used for gain adjustment purposes. An output 47 of the amplifier 46 is connected to an input 20' of the amplifier 12' at the end of the feedback circuit 22'. An inductor 26' is connected in series with a capacitive device 27' under test which is connected to ground. The inductor 26' has a series resistance $R'_L$ at a resonant frequency with the circuit components 26', 27' corresponding to the resistance $R_L$ discussed in connection with FIG. 3. A capacitor $C'_x$ under test has a series resistance ESR' at the resonant frequency of the circuit components 26', 27'. A switch 50 is connected in series with the resistor-inductor circuit components 26', 27'. For calibration purposes, a switch pole 52 is set to a contact 54, a switch pole 56 is set to a contact 60, and a switch pole 66 is set to a contact 64.

Thus, during calibration, the signal from the frequency source 16 is applied to the input of the amplifier 40, the output of which is applied to the transformer 44 where the signal voltage is stepped-down and then applied to the input of the operational amplifier 46. The variable resistor 49 will then adjust the gain of the amplifier 46 at the particular operating frequency until the input voltage V₁ equals the output voltage V₂, thereby restoring the voltage reduction of the transformer 44. For measurement purposes the switch pole 56 is set to contact 62; the switch pole 66 is set to contact 68 and the switch pole 52 is set to contact 53. Resonance may be obtained by varying the inductor 26′ or by changing the frequency of the source 16 until the output voltage V₂ on the voltmeter 30 is maximum.

The determination of the resonance resistance ESR′ of the capacitor C′ₓ and of the capacitive reactance of device 27′ to yield the Q-factor of the device 27′ is made in the same way as explained above for device 27 of the circuit 10.

Since the impedance level of the feedback network 22′ is reduced to a very low value, circuit 10A may be used for determining high Q-factors of capacitive devices where the total series resonance resistance R′ₗ+ESR′ has a very low magnitude.

It should be understood that the foregoing relates to only a limited number of preferred embodiments of the invention, which have been presented by way of example only, and that it is intended to cover all changes and modifications of the examples of the invention herein chosen for the purpose of the disclosure, which do not constitute departures from the spirit and scope of the invention.

What is claimed is:

1. A meter circuit for determining the Q-factor of a capacitive device, comprising,
    an operational amplifier having two input terminals and an output terminal having a measureable output voltage;
    means for applying a measurable input voltage adjustable in frequency and magnitude to one of said input terminals of said amplifier;
    a feedback circuit connected between the other one of said input terminals and said output terminal of said amplifier;
    a resistor having a resistance of known magnitude in said feedback circuit; and
    a network having one end connected in said feedback circuit between the junction of said resistor and said other one of said input terminals the other end grounded, said network comprising an inductor of known Q-factor and resistance and means connecting in series with said inductor a device of known capacitance whose Q-factor is to be determined, whereby when said circuit is caused to resonate, the Q-factor of said device is obtained by dividing the capacitance reactance of said device by the effective series resistance of said device obtained from said resistance, the series resonant resistance of said inductor, and the ratio of said output voltage to said input voltage of said amplifier.

2. A meter circuit as defined in claim 1, wherein said network has a resonance at a particular frequency of said input voltage, and wherein said Q-factor to be determined is expressed as:

$$Q_x = \frac{X_{cx}}{ESR},$$

wherein
    $X_{cx}$ is a capacitive reactance of said device at said resonance frequency and equal to the inverse multiplication of the resonant frequency, said capacitance of said device, and $2\pi$, and wherein ESR is an effective series resistance of said device at said resonance frequency of said network.

3. A meter circuit as defined in claim 2, further comprising means for measuring input and voltage across said output terminals of said amplifier, whereby said effective series resistance of said device is expressed as:

$$ESR = \frac{R_f}{A} - R_L,$$

wherein
    $R_f$ is said known resistance of said resistor in said feedback circuit, $R_L$ is the series magnitude of said inductor at said resonance frequency of said network, and A is the gain of said amplifier expressed as a ratio of the voltage between said input and output terminals thereof.

4. A meter circuit as defined in claim 3, wherein said voltage measuring means are voltmeters respectively connected across said output and said input terminals of said amplifier.

5. A meter circuit as defined in claim 3 further comprising a wideband voltage stepdown transformer having a very low output impedance connected in said feedback circuit in series with said resistor therein; and another operational amplifier connected in said feedback circuit to compensate for the voltage reduction produced by said stepdown transformer, whereby said Q-factor of said device is accurately determined even though it has a high numerical value, and even though said series resistance of said inductor at said resonance frequency plus said effective series resistance of said device have a very low magnitude.

6. A meter circuit as defined in claim 5, wherein said other amplifier has other input and output terminals, and further comprising another feedback circuit connected between said other input and said output terminals and having an adjustable resistor therein for calibrating said other amplifier.

7. A meter circuit as defined in claim 6, further comprising a further operational amplifier connected in said first named feedback circuit between said transformer and said first named amplifier to serve as a buffer therebetween.

8. A meter circuit as defined in claim 7, further comprising other voltage measuring means for measuring said input voltage across said input terminals of said first named amplifier, and wherein said gain of said first amplifier is expressed as:

$$A = \frac{V_2}{V_1},$$

wherein
    $V_2$ is the magnitude of said output voltage measured by said first mentioned voltage measuring means, and $V_1$ is the magnitude of said input voltage measured by said other voltage measuring means.

9. A meter circuit as defined in claim 8, wherein said first mentioned and said other voltage measuring means are voltmeters respectively connected across said output terminals and said input terminals respectively of said first named amplifier.

* * * * *